(12) United States Patent
Wang et al.

(10) Patent No.: US 12,336,173 B2
(45) Date of Patent: Jun. 17, 2025

(54) ANTI-FUSE ONE-TIME PROGRAMMABLE NONVOLATILE MEMORY CELL AND MEMORY THEREOF

(71) Applicant: Chengdu Analog Circuit Technology Inc, Sichuan (CN)

(72) Inventors: Ming Wang, Sichuan (CN); Teng Feng Wang, Sichuan (CN); Meifang Lee, Sichuan (CN)

(73) Assignee: CHENGDU ANALOG CIRCUIT TECHNOLOGY INC

( * ) Notice: Subject to any disclaimer, the term of this patent is extended or adjusted under 35 U.S.C. 154(b) by 541 days.

(21) Appl. No.: 17/467,774

(22) Filed: Sep. 7, 2021

(65) Prior Publication Data

US 2023/0011223 A1   Jan. 12, 2023

(30) Foreign Application Priority Data

Jul. 6, 2021   (CN) .......................... 202110759548.4

(51) Int. Cl.
  *H10B 20/25*   (2023.01)
(52) U.S. Cl.
  CPC .................................... *H10B 20/25* (2023.02)
(58) Field of Classification Search
  CPC . H10B 20/20; H10B 20/25; H01L 2924/1453; G11C 17/14; G11C 17/143; G11C 17/146; G11C 17/16; G11C 16/165; H10L 23/525; H10L 23/5252; H10L 23/5254; H10L 23/5256; H10L 23/5258
  See application file for complete search history.

(56) References Cited

U.S. PATENT DOCUMENTS

| | | | |
|---|---|---|---|
| 9,583,161 B1 * | 2/2017 | Kim | G11C 29/781 |
| 10,032,783 B2 * | 7/2018 | Shum | H01L 23/5252 |
| 2008/0179685 A1 * | 7/2008 | Petti | H01L 27/105 |
| | | | 257/E21.666 |
| 2010/0165698 A1 * | 7/2010 | Liu | G11C 17/14 |
| | | | 326/39 |
| 2014/0209989 A1 | 7/2014 | Kurjanowicz | |

(Continued)

FOREIGN PATENT DOCUMENTS

| | | | | |
|---|---|---|---|---|
| CN | 111916423 A | * | 11/2020 | ....... H01L 21/76897 |
| EP | 2966686 B1 | * | 12/2020 | ............. G11C 16/08 |

(Continued)

*Primary Examiner* — Fernando L Toledo
*Assistant Examiner* — Marshall Mu-Nuo Hatfield
(74) *Attorney, Agent, or Firm* — SHIMOKAJI IP (57) ABSTRACT

A one-time programmable nonvolatile memory cell includes a substrate providing a first conductivity type well and a second conductivity type well, a first MOS transistor having a floating gate and a gate oxide, and an auxiliary gate and a gate oxide formed by extending one end of the floating gate and the gate oxide of the first MOS transistor from an edge of the first active region, along a second direction perpendicular to the first direction, passing through the isolation region until to cover a part or an entire of the second active region. The first and the second active regions are separated by an isolation region, and the first and second active regions and the isolation region are arranged parallel to each other along a first direction. The memory cell has an improved structure and optimized performance and a reduced size.

6 Claims, 4 Drawing Sheets

(56) References Cited

U.S. PATENT DOCUMENTS

| | | | | |
|---|---|---|---|---|
| 2015/0371995 | A1* | 12/2015 | Kaemmer | H01L 21/02255 |
| | | | | 257/379 |
| 2017/0040330 | A1* | 2/2017 | Hsu | G11C 16/10 |
| 2017/0301682 | A1* | 10/2017 | Li | G11C 17/16 |
| 2019/0115076 | A1* | 4/2019 | Chen | G06F 7/588 |
| 2019/0214400 | A1* | 7/2019 | Hsu | G11C 16/26 |
| 2020/0006363 | A1* | 1/2020 | Hsu | G11C 16/12 |
| 2020/0091168 | A1* | 3/2020 | Hsu | H10B 41/35 |
| 2021/0202503 | A1 | 7/2021 | Chang et al. | |

FOREIGN PATENT DOCUMENTS

| | | | | |
|---|---|---|---|---|
| JP | 2013187534 | A | 9/2013 | |
| KR | 100195867 | B1 * | 6/1999 | H10B 20/20 |
| KR | 20120068492 | A | 6/2012 | |

\* cited by examiner

| Operation | | Word line (WL) | Bit line (BL) | Common line (COM) | Auxiliary gate oxide layer | Result |
|---|---|---|---|---|---|---|
| Programming | Cell 400 | 6v | 0v | Suspended | ~ 5v | Programmed |
| | Cell 410 | 6v | 4v | | ~ 2v | Unchanged |
| | Cell 420 | 2v | 0v | Suspended | ~ 2v | Unchanged |
| | Cell 430 | 2v | 4v | | ~ -2v | Unchanged |

| Operation | | Word line (WL) | Bit line (BL) | Common line (COM) |
|---|---|---|---|---|
| Read | Cell 400 | 1.2v | 0v | 2.5 |
| | Cell 410 | 1.2v | 2.5v | |
| | Cell 420 | 0v | 0v | 2.5 |
| | Cell 430 | 0v | 2.5v | |

FIG. 6

ANTI-FUSE ONE-TIME PROGRAMMABLE NONVOLATILE MEMORY CELL AND MEMORY THEREOF

FIELD OF THE INVENTION

The present invention relates to a nonvolatile memory cell and a memory thereof, further to a one-time programmable nonvolatile memory cell, in particular to an anti-fuse one-time programmable memory cell and array structure thereof.

BACKGROUND OF THE INVENTION

As well known, nonvolatile memories include a multi-program memory (MTP for short), a one-time programmable memory (OTP for short), and a mask read-only memory (Mask ROM for short).

For the multi-program memory, the user may program it and modify the stored data for multiple times. For the one-time programmable memory, the user may only program once. That is, once the programming of a one-time programmable memory is completed, no any modification can be made to the stored data. For the mask read-only memory, all the stored data has been recorded once it's shipped from the factory, and the user may only read the stored data from the memory, instead of programming.

One-time programmable memory can be divided into floating-gate OTP memory, electric fuse OTP memory and anti-fuse OTP memory according to its characteristics. The memory cell of the floating-gate OTP memory is based on the fact that the threshold voltage of the device is changed after electrons or holes are injected into the floating gate, so as to achieve a switch between the high-resistance state and low-resistance state. While the memory cell of the electric fuse OTP memory is in a low-resistance memory state when no programming occurs, and is in a high-resistance memory state after programming, which is usually realized based on electromigration of a polysilicon gate. While the memory cell of the anti-fuse type one-time programmable memory is in a high-resistance memory state when no programming occurs, and is in a low-resistance memory state after programming, As the semiconductor manufacturing process continues to miniaturize, the electrons or holes captured by the floating-gate OTP memory in the advanced process are easily leaked to cause data loss. While the electric fuse OTP memory is limited to the polysilicon gate, and its usage will be restricted if the polysilicon gate is replaced with a metal gate in the advanced process. The anti-fuse OTP memory is based on the mechanism of physical breakdown of the gate oxide layer, there is no risk of electron or hole leakage, or polysilicon gate limitation, which has high compatibility with the advanced process therefore, and has received great attentions in recent years and made great progress.

At present, it's a continuous need to improve the structure of the anti-fuse OTP memory, optimize the performance, and bring a smaller size.

SUMMARY OF THE INVENTION

The present invention relates to an anti-fuse nonvolatile memory cell and a memory thereof.

A first aspect of the present invention is to provide a one-time programmable nonvolatile memory cell including:

a substrate, providing a first conductivity type well and a second conductivity type well that are adjacent; the first conductivity type well having a first active region, and the second conductivity type well having a second active region, the first active region and the second active region that are adjacent being separated by an isolation region which spans the first and the second conductivity type wells; and the first and second active regions and the isolation region being arranged parallel to each other along a first direction;

a first MOS transistor, located on the first active region and comprising a floating gate and a gate oxide below the floating gate; and an auxiliary gate and another gate oxide below the auxiliary gate, formed by: extending one end of the floating gate and the gate oxide of the first MOS transistor from an edge of the first active region, along a second direction perpendicular to the first direction, passing through the isolation region until to cover a part or an entire of the second active region.

In a preferable embodiment, a ratio of an area of the floating gate on the first active region to an area of the auxiliary gate on the second active region is 2:1-40:1, more preferably is 5:1-35:1, further preferably is 10:1-30:1.

In another preferable embodiment, a ratio of a thickness of the floating gate oxide on the first active region to a thickness of the auxiliary gate oxide on the second active region is 1:1-5:1, more preferably is 1.5:1-4.5:1, further preferably is 2:1-4:1.

In another preferable embodiment, the auxiliary gate and the gate oxide thereof are extended along the second direction to cover the entire of the second active region. In such a way, the gate and the gate oxide layer of the second MOS transistor and are formed, which are located on the second active region. The second MOS transistor may also be referred to as an auxiliary MOS transistor.

In another preferable embodiment, the first conductivity type well is a P well, and the first active region comprises two N-type ion-doped regions respectively located at both sides of the floating gate along the first direction to serve as a source and a drain of the first MOS transistor, respectively, which is an NMOS transistor; and the second conductivity type well is an N well, and the second active region comprises two P-type ion-doped regions respectively located at both sides of the auxiliary gate along the first direction to form a second MOS transistor which is a PMOS transistor.

In another preferable embodiment, the first conductivity type well is an N well, and the first active region comprises two P-type doped regions respectively located at both sides of the floating gate along the first direction to serve as a source and a drain of the first MOS transistor, respectively, which is a PMOS transistor; and the second conductivity type well is a P well, and the second active region comprises two N-type doped regions respectively located at both sides of the auxiliary gate along the first direction to form a second MOS transistor which is an NMOS transistor.

A second aspect of the present invention is to provide a one-time programmable nonvolatile memory cell set including four said memory cells arranged in an array of 2 rows×2 columns, and the substrates of all memory cells are combining into one unity. two memory cells in each row are left-right mirror symmetrical, and the first conductivity type wells, the second conductivity type wells, the first active regions, the second active regions, and the isolation regions of the two memory cells in each row, are combined into a respective unity, and the first active regions, the second active regions, and the isolation regions are arranged in parallel to each other along the first direction; two memory cells in each column are centrally symmetrical, and two adjacent first active regions or two adjacent second active regions in the two memory cells in each column are separated by a respective isolation region.

In a preferable embodiment, each memory cells has the same composition and the same structure.

A third aspect of the present invention is to provide a one-time programmable nonvolatile memory including at least one or two said memory cell set(s), the memory cell sets have the same arrangement, the substrates of all memory cells in each memory cell set are formed into one unity to form a substrate.

In the array, the first conductive wells, the second conductive wells, the first active regions, the second active regions, and the isolation regions of all memory cells in each row are combined into a respective unity, and the first and the second active regions, and the isolation regions are all arranged parallel to each other along the first direction.

In the array, two adjacent first active regions or two adjacent second active regions of two adjacent memory cells in each column are separated by a respective isolation region.

A bit line and a common line located on both sides of each column are configured, and the bit line and the common line are alternately arranged in the array, the bit line and the common line in each column are respectively coupled to a drain and a source of the first MOS transistor on each first active region of all memory cells in the column, or respectively coupled to the source and the drain of the first MOS transistor.

A word line is configured in each row and coupled to one or two of the ion-doped regions on both sides of the auxiliary gate on each second active region of all memory cells in the row.

In a preferable embodiment, each memory cell set in the array has the same composition and the same structure.

In the anti-fuse one-time programmable memory cell of the present invention, there is only one floating gate and one auxiliary gate formed by extending one end of the floating gate. On the contrary, a conventional anti-fuse one-time programmable memory cell generally has two transistors and two floating gates. By this token, the memory cell of the present invention has simpler structure, less components, smaller size and better performance accordingly.

In the present invention, the area of the auxiliary gate is preferably smaller than that of the floating gate of the first MOS transistor. When an operating voltage is applied to the floating gate and the auxiliary gate at the same time, the auxiliary gate on the second active region bears a larger partial voltage, thus it's more likely to breakdown the auxiliary gate oxide layer to become a low-resistance state for programming. In addition, the thickness of the auxiliary gate oxide is preferably thinner than that of the floating gate oxide of the first MOS transistor, which is conducive to the low-voltage breakdown of the auxiliary gate oxide layer and reducing the breakdown voltage required for programming.

In addition, statistically speaking, a memory composed of a plurality of the above-mentioned anti-fuse memory cells of the present invention may further increase the convergence of the resistance distribution of the auxiliary gate oxide after breakdown, that is, the breakdown positions of the auxiliary gate oxides of all memory cells in the memory are closer and more concentrated.

Furthermore, the arrangements of the memory cell set and the memory composed of the memory cell set of the present invention are optimized, which may further reduce the size of the entire memory meanwhile maintain its performance.

BRIEF DESCRIPTION OF THE DRAWINGS

FIGS. 5a-5b show a 2×2 array of memory cell set according to an embodiment of the present invention.

DETAILED DESCRIPTION OF ILLUSTRATED EMBODIMENTS

A one-time programmable nonvolatile memory cell of the present invention may or may not be a single-layer polysilicon, and is preferably a single-layer polysilicon. The gates of the first MOS transistor and the auxiliary MOS transistor may be the same or different, and are selected from a single-layer polysilicon gate or a metal gate. The gate oxides of the two MOS transistors may be the same or different, and are selected from high dielectric constant oxides, such as $SiO_2$, $HfO_2$, HfSiO, HfSiON, HfTaO, HfSiO, HfZrO, $Al_2O_3$, $La_2O_3$, $ZrO_2$, or LaAlO. Preferably, the gate oxides of the both MOS transistors are silicon dioxide layers.

In the one-time programmable nonvolatile memory cell of the present invention, the substrate is a conventional semiconductor substrate, but a P-type substrate is preferred.

In the above-mentioned memory cell of the present invention, both the first conductivity type well and the second conductivity type well are located on the substrate, and arranged adjacent to each other. Specifically, the conductivity types of the two wells are different however, for example, if the first conductivity type well is an N well, then the second conductivity type well is a P well; vice versa.

An active region is a region where active circuit components such as transistors are formed and operated. For example, a source and a drain of the transistor are formed in the active region. A first active region is included in the first conductivity type well, and a second active region is included in the second conductivity type well. The first active region and the second active region are separated by an isolation region which spans two adjacent wells. The first and the second active regions and the isolation regions are all arranged parallel to each other.

In the first conductivity type well, the first active region includes two conductive ion-doped regions, which are located at both sides of the floating gate of the first MOS transistor and the gate oxide thereof, and respectively forms the source and the drain of the first MOS transistor.

The type of the conductive ion-doped region in the first active region may be N-type or P-type. When the first conductivity type well is a P well, the both two ion-doped regions in the first active region are N-type to serve as the source and the drain of the first MOS transistor respectively, and namely the first MOS transistor is an NMOS transistor. When the first conductivity type well is an N well, the both two ion-doped regions in the first active region are P-type to serve as the source and the drain of the first MOS transistor respectively, and namely the first MOS transistor is a PMOS transistor.

The source and the drain in the first MOS transistor are the same and can be used interchangeably.

The first direction described in the present invention is the direction from the source to the drain, or the direction from the drain to the source, of the first MOS transistor, within the top surface of the active region. The second direction is the direction perpendicular to the first direction within the top surface of the active region.

The length of the floating gate of the first MOS transistor is the dimension of the floating gate between the source and the drain in the first direction. The width of the floating gate is the dimension of the floating gate on the first active region in the second direction. The length and the width of the gate oxide under the floating gate are the same as those of the floating gate. The area of the floating gate is the product of the length and the width of the floating gate on the first active region, and the area of the gate oxide is the same as that of the floating gate.

One end of the floating gate and the gate oxide of the first MOS transistor is extended from the edge of the first active region, along the width direction of the floating gate (that is, the second direction), passes through the isolation region until to reach the second active region; sequentially, the end is extended along the current direction to cover a part or an entire of the second active region to form an auxiliary gate. The definitions of the length and width of the auxiliary gate are the same as those of the floating gate. The area of the auxiliary gate is the product of the length and the width of the auxiliary gate on the second active region. The length and the width of the gate oxide under the auxiliary gate are the same as those of the auxiliary gate, and the area of the both is also the same.

The area of the auxiliary gate is smaller than that of the floating gate, and the ratio of the area of the floating gate to the area of the auxiliary gate is 2:1-40:1.

In the second conductivity type well, the second active region includes two conductive ion-doped regions respectively located at both sides of the auxiliary gate to form a source and a drain which form a second MOS transistor (also called an auxiliary transistor) together with the auxiliary gate and the gate oxide thereof. The second active region may also include a conductive ion-doped region located at one side of the auxiliary gate to form a capacitor together with the auxiliary gate and the gate oxide thereof. In this case, the length and the width of the auxiliary gate are the dimensions of the auxiliary gate in the first direction and the second direction in the second active region, respectively. Preferably, the second active region includes two conductive ion-doped regions.

When the auxiliary gate is extended in the second direction to cover a part but not an entire of the second active region, even if the second active region contains two conductive ion-doped regions located on both sides of the auxiliary gate, still a capacitor but not a MOS transistor is formed together with the auxiliary gate and the gate oxide thereof.

It is more conducive to breakdown the programming when the auxiliary gate is extended to cover a part but not the entire of the second active region, nevertheless, it's preferable to extend the auxiliary gate to cover the entire but not a part of the second active region, for improving the controllability and the repeatability of the process preparation, thereby increasing the yield of products.

The type of the conductive ion-doped region in the second active region may also be N-type or P-type. However, since the conductivity type of the second well is different from that of the first well, the type of the conductive ion-doped region in the second active region is also different from that in the first active region. For example, when the first well is a P well, the second well is an N well, the ion-doped region in the second active region is P-type, and the second MOS transistor is a PMOS transistor. When the first well is an N well, the second well is a P well, the ion-doped region in the second active region is N-type, and the second MOS transistor is an NMOS transistor.

The isolation region is also called shallow trench isolation region (STI for short). In the present invention, there is an isolation region between two adjacent active regions for separation, and the isolation region spans two adjacent wells.

The first active region, the second active region, and the isolation region are all arranged parallel to each other along the first direction.

In the present invention, the area of the floating gate on the first active region may be a normal value in the art. Preferably, the area of the auxiliary gate on the second active region is smaller than the area of the floating gate on the first active region. Preferably, the ratio of the area of the floating gate on the first active region to the area of the auxiliary gate on the second active region is 2:1-40:1, more preferably is 5:1-35:1, further preferably is 10:1-30:1. In such a ratio, a partial pressure on the auxiliary gate can be increased, so that the oxide layer of the auxiliary gate is more likely to break down and become a low-resistance state for programming.

In addition, the thickness of the floating gate oxide on the first active region may be a normal value in the art. Comparing with the thickness of the floating gate oxide, the thickness of the auxiliary gate on the second active region may be the same or smaller. For example, the ratio of the thickness of the floating gate oxide on the first active region to the thickness of the auxiliary gate oxide on the second active region is 1:1-5:1, preferably is 1.5:1-4.5:1, more preferably is 2:1-4:1. In such a ratio, a breakdown voltage required to reach the breakdown field strength can be reduced, which is more conducive to achieving the breakdown.

In the one-time programmable nonvolatile memory cell set of the present invention, four said memory cells are included and arranged in an array of 2 rows×2 columns, and the substrates of all memory cells are formed into one unity.

The arrangement of the two memory cells in each row may be the same or different. Preferably, the two memory cells in each row are in different arrangements, such as in left-right mirror symmetry, for obtaining a compact and small array.

Specifically, the first conductivity type wells, the second conductivity type wells, the first active regions, the second active regions, and the isolation regions of the two memory cells in each row, are combined into a respective unity, that is, the two conductivity type wells in each row are formed in one unity, the two second conductivity type wells in each row are formed in one unity, the two first active regions in each row are formed in one active region, similarly the two second active regions in each row are formed in one active region, and the two isolation regions in each row are formed in one isolation region. The said three regions are arranged in parallel to each other along the first direction.

The arrangement of the two memory cells in each column may be the same or different. For obtaining a compact and small array, preferably, the two memory cells in each column are in different arrangements, such as in up-down mirror symmetrical or central symmetrical arrangement preferably. The central symmetrical arrangement means that either of the both can be completely overlapped with the other after being rotated 180° around the center of symmetry.

Two adjacent first active regions or two adjacent second active regions in the two memory cells in each column are separated by a respective isolation region.

Preferably, the four memory cells have the same composition and structure.

The source and the drain of the first MOS transistor of each memory cell in each set are the same and can be used interchangeably.

By using the above preferable arrangement of the memory cell in the set, it's beneficial to reduce the size of the memory cell set, and maintain the performance thereof.

An anti-fuse one-time programmable nonvolatile memory of the present invention includes at least one said memory cell set to form an array. The arrangement of each set in the array is the same, and the substrates of the memory cells of all sets are formed into one unity to serve as the substrate of the array. In the array, the first conductive wells and the second conductive wells of all memory cells in each row are formed into a respective unity; the first active regions, the second active regions, and the isolation regions are also formed into a respective individual region, and the three regions are all arranged parallel to each other along the first direction. In the array, two adjacent first active regions or two adjacent second active regions of adjacent memory cells in odd and even rows in each column, are also separated by a respective isolation region. A bit line (BL) and a common line (COM) located on both sides of each column are configured, and the bit line and the common line are alternately arranged in the array. Specifically, the bit line and the common line in each column are respectively coupled to the drain and the source of the first MOS transistor on the first active region of the memory cell in the column, or respectively coupled to the source and the drain of the first MOS transistor. A word line (WL) is configured in each row and coupled to one or two of the ion-doped regions on both sides of the auxiliary gate on the second active region of all memory cells in the row.

The source and the drain of the first MOS transistor in each memory cell in the array can be interchangeable, and the arrangements of the four memory cells in each set of the array are different, so that all bit lines (BL) coupled to one pole of the first MOS transistors in each column are located on one side of the column, and all common lines (COM) coupled to the other pole re located on the other side of the column. In the array, the bit lines and the common lines are arranged alternately.

Preferably, the composition and structure of each set in the array are the same.

The above-mentioned memory of the present invention has a simple structure, a small size and a low breakdown voltage required for programming, and the breakdown positions of the auxiliary gate oxide layers of a plurality of memory cells are closer and more concentrated.

The memory cell and memory of the present invention may be prepared by mature conventional processes, such as logic processes of 180 nm, 130 nm, 90 nm, 55 nm, or 40 nm. In addition, logic processes of 28 nm, 22 nm, 16 nm, 10 nm, 7 nm, or 5 nm may also be used. The area of the floating gate on the first active region and the area of the auxiliary gate on the second active region are different, which depends on the pattern sizes of their respective active region and the respective gate. The patterns of the active region and the gate can be formed in a common manner in the industry. For example, the patterns of the active region and the gate may be generated by photoetching and dry etching by using the corresponding photolithography, and their shape and size may be defined in the layout design. The floating gate oxide layer and the auxiliary gate oxide layer have different thickness, which may be also formed by a growth method, such as a thermal oxidation method, commonly used in the industry. For example, in the thermal oxidation method, a gate oxide layer with a thickness of 1 is grown on the region where a floating gate oxide layer and a auxiliary gate oxide layer are to be formed, and then the gate oxide layer that has been generated on the region where the auxiliary gate oxide is to be formed is completely removed by the wet method, and then by using the thermal oxidation method again, a new layer of gate oxide is formed on the two gate oxide regions at the same time, to reach the required thickness of the auxiliary gate oxide. The thickness of 1 is the difference between the thickness of the floating gate oxide layer and the auxiliary gate oxide layer.

The present invention will be described in detail below in conjunction with specific embodiments. The specific embodiments are only used to illustrate and understand the technical solutions of the present invention, which are not limitations to the protection scope of the present invention. Without departing from the purpose and scope of the present invention, those of ordinary skill in the art may make structural, logical, and electrical modifications to the following specific embodiments, and apply them to other embodiments, which are all within the protection scope of the present invention.

Those of ordinary skill in the industry can fully understand the present invention through the following detailed description. In addition, some system configurations and process steps that are well-known to those of ordinary skill in the art are not detailed here.

In addition, the drawings of the specific embodiments are just schematic diagrams, which are not drawn strictly according to the actual scale. Sometimes, some dimensions are enlarged in order to clearly present a certain partial structure. For the convenience of illustration and description, similar features are usually indicated by the same reference numerals, when the multiple embodiments disclosed and described herein have common or similar features.

Although specific voltage values are provided in the embodiments and drawings, it should be understood that these values do not have to be precise values, but are used to express the general concept of the technical solution of the present invention.

Figure 1:
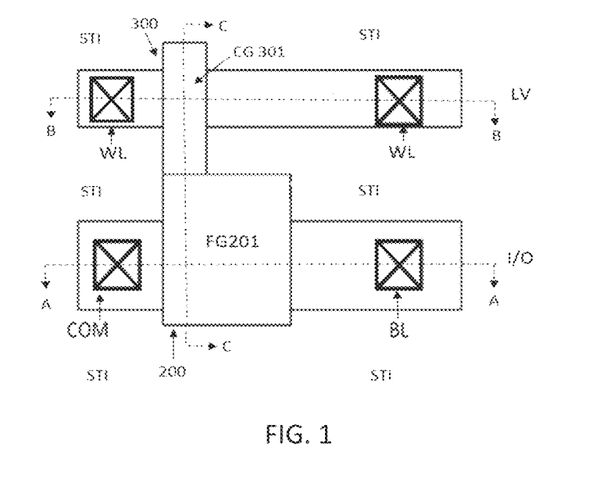
FIG. 1 is a top view of an anti-fuse memory cell according to one embodiment of the present invention.
Figure 2:
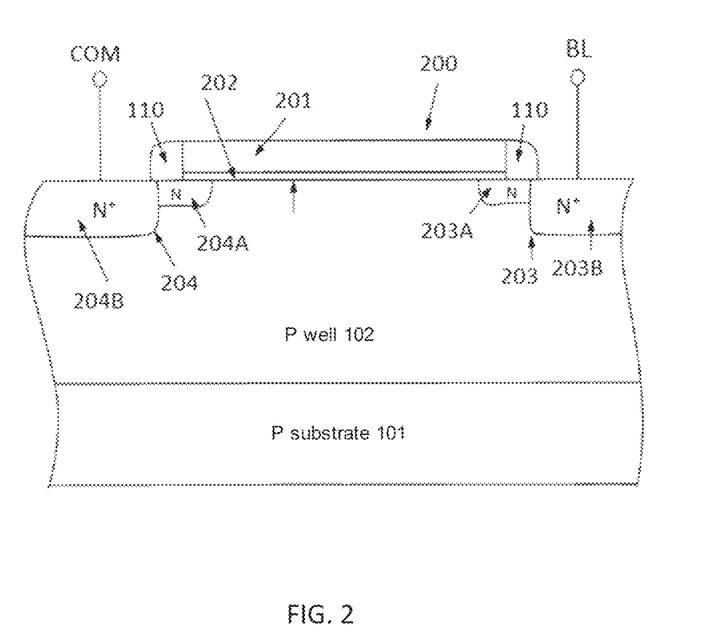
FIG. 2 is a cross-sectional view of the memory cell in the embodiment shown in FIG. 1 along the section line A-A.
Figure 3:
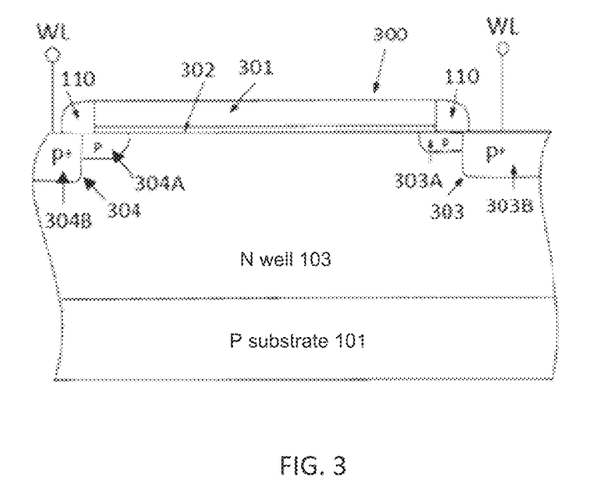
FIG. 3 is a cross-sectional view of the memory cell in the embodiment shown in FIG. 1 along the section line B-B.
Figure 4:
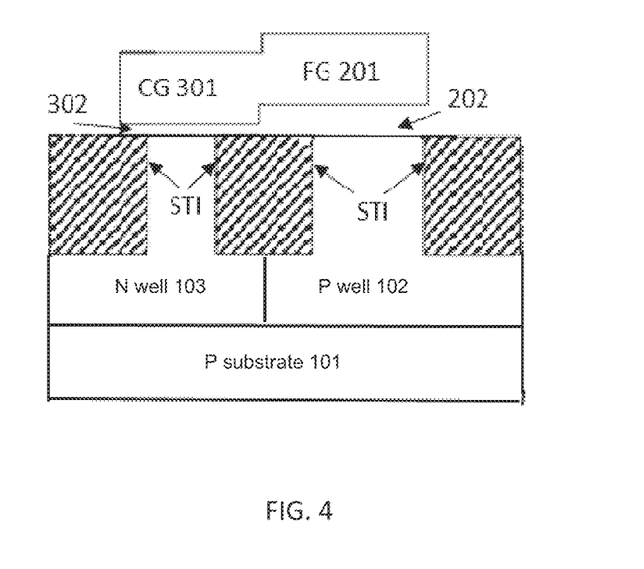
FIG. 4 shows a cross-sectional view of the memory cell in the embodiment shown in FIG. 1 along the section line C-C.

According to one embodiment of the present invention, an anti-fuse one-time programmable nonvolatile memory cell is provided. FIG. 1 is a top view of an anti-fuse memory cell, and FIGS. 2-4 are cross-sectional views of the memory cell along the section lines A-A, B-B, C-C respectively.

In this embodiment, the unit is manufactured by logic process of 40 nm, which may provide transistors with different gate areas and different gate oxide thicknesses. All processing steps required for forming the above-mentioned store units are those steps required used in the logic manufacturing process for forming other circuits on the chip, no additional processing steps are required therefore.

In this embodiment, the memory cell is built in a P-type silicon substrate 101. The P well 102 and the N well 103 are adjacent to each other and are provided in the P-type substrate 101. In the P well 102 and the N well 103, a first active region, a second active region and an isolation region (STI) separated therebetween are formed respectively, and the isolation region (STI) spans the two wells. The two active regions and the isolation regions are all arranged parallel to each other along the first direction.

An NMOS transistor 200 is configured on the first active region in the P well 102. Two N-type ion-doped regions 203 and 204 are provided in the first active region, which respectively constitute the N-type source and N-type drain of the NMOS transistor. The source and the drain of the NMOS transistor are the same and can be interchanged. That is, the drain may be the doped region 203, and the source may be the doped region 204, alternatively, the drain may be the doped region 204, and the source may be the doped region 203.

Specifically, the doped region 203 includes a lightly doped N region 203A and a heavily doped N+ region 203B. The doped region 204 includes a lightly doped N region 204A and a heavily doped N+ region 204B. When the doped region 203 is served as the drain and coupled to the bit line (BL), then the doped region 204 is the served as the source and coupled to the common line (COM), as shown in FIG. 2.

The transistor 200 is surrounded by an isolation region (STI, also called a shallow trench isolation region). A channel region is formed between the source and the drain, on which a gate oxide layer 202 is covered. A conductively doped single-layer polysilicon gate 201 is placed on the top of the gate oxide layer 202 to form a floating gate (FG) 201 of the NMOS transistor.

The floating gate (FG) 201 and its gate oxide 202 are extended along the width direction (namely the second direction) of the floating gate, pass through the isolation region STI, and then are extended to the second active region in the N well 103, and sequentially cover the entire second active along the second direction, to finally form an auxiliary gate (CG) 301 and its gate oxide 302 on the second active region.

The floating gate 201 and the auxiliary gate 301 are both surrounded by an isolation sidewall 110, which is generally formed of silicon nitride or silicon oxide.

In the second active region in the N well 103, P-type ion-doped regions 303 and 304 are respectively formed at both sides of the auxiliary gate 301 to serve as the source and the drain, which form a second PMOS transistor 300 (also known as auxiliary transistor) together with the auxiliary gate and the gate oxide thereof. Specifically, the P-type ion-doped region 303 includes a lightly doped P region 303A and a heavily doped P+ region 303B, and the doped region 304 includes a lightly doped region 304A and a heavily doped P+ region 304B. The source and the drain of the second MOS transistor are coupled to the word line (WL).

When forming the N+ or P+ region, the isolation sidewall 110 is configured to prevent N+ or P+ implantations from entering the lightly doped N or P region.

In this embodiment, the ratio of the area of the floating gate FG 201 to the auxiliary gate CG 301 is 18:1-20:1, and the ratio of the thickness of the floating gate oxide layer to the thickness of the auxiliary gate oxide layer is 2:1-3:1, both the area of the floating gate FG 201 and the thickness of the floating gate oxide layer can be ordinary values, for example, the thickness may be 40-120 Å.

In most applications, multiple nonvolatile memory cells can be placed together to form a memory array. For illustrative purposes, a 2×2 memory array and the operation thereof are depicted and shown in FIGS. 5a-5b. The array includes four memory cells as shown in FIGS. 1-4, arranged in 2 rows and 2 columns. By increasing and/or decreasing the number of rows and/or columns, arrays of different sizes can be formed. In this embodiment, the memory array includes memory cells 400, 410, 420 and 430. The memory array includes NMOS transistors 401, 411, 421 and 431, and PMOS auxiliary transistors 402, 412, 422 and 432.

Figure 5A:
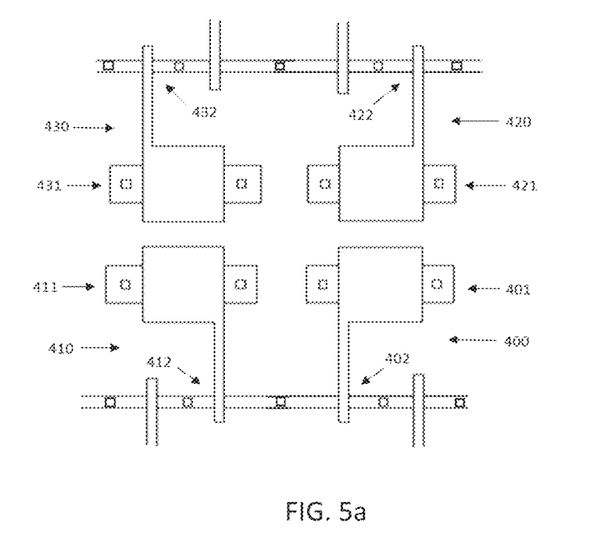
FIG. 5a is a top view of the array.
Figure 5B:
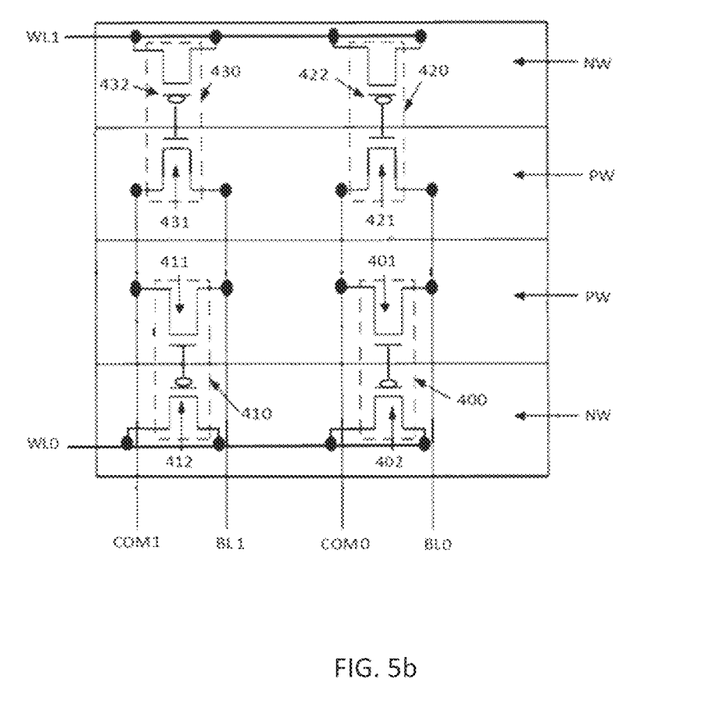
FIG. 5b is a circuit diagram of the array.

In one embodiment, the WLs of the memory cells 400 and 410 are coupled to WL0 to form a memory row, and the WLs of the memory cells 420 and 430 are coupled to WL1 to form another memory row. The common lines (COM) and bit lines (BL) of the memory cells 400 and 420 are respectively coupled to COM0 and BL0 to form a memory column. Similarly, the common lines (COM) and bit lines (BL) of the memory cells 410 and 430 are coupled to COM1 and BL1, respectively, to form another memory column.

The word line (WL) in each row is coupled to the drain or the source of each PMOS auxiliary transistor in the row.

The common line (COM) and bit line (BL) in each column are respectively located on both sides of the column, and the common line and bit line are respectively connected to the source and the drain, or the drain and the source of each NMOS transistor in the column. Further, the common lines and bit lines in the array are alternately arranged, as shown in FIG. 5. The source and the drain of each NMOS transistor can be interchanged.

The memory array is constructed in a P-type substrate. The N wells and P wells of all memory cells in a memory row are combined separately. Thus, each memory row contains one N well and one P well. The two P wells of adjacent odd and even rows are placed next to each other, or alternatively can be combined into one unity.

By combining the wells in a row, the memory cells in the array can be more tightly packaged, that's because most of the space between the wells is eliminated. The memory array is constructed in the same substrate as other logic circuits on the chip, and the substrate in the logic circuit needs to be grounded or 0 v.

The first active regions of all memory cells in each memory row are combined into one region, and similarly, the second active regions and the isolation regions of all memory cells are respectively combined into one region. In each memory row, the three regions are arranged parallel to each other along the first direction.

Each memory cell in the array can be programmed independently.

Figure 6:
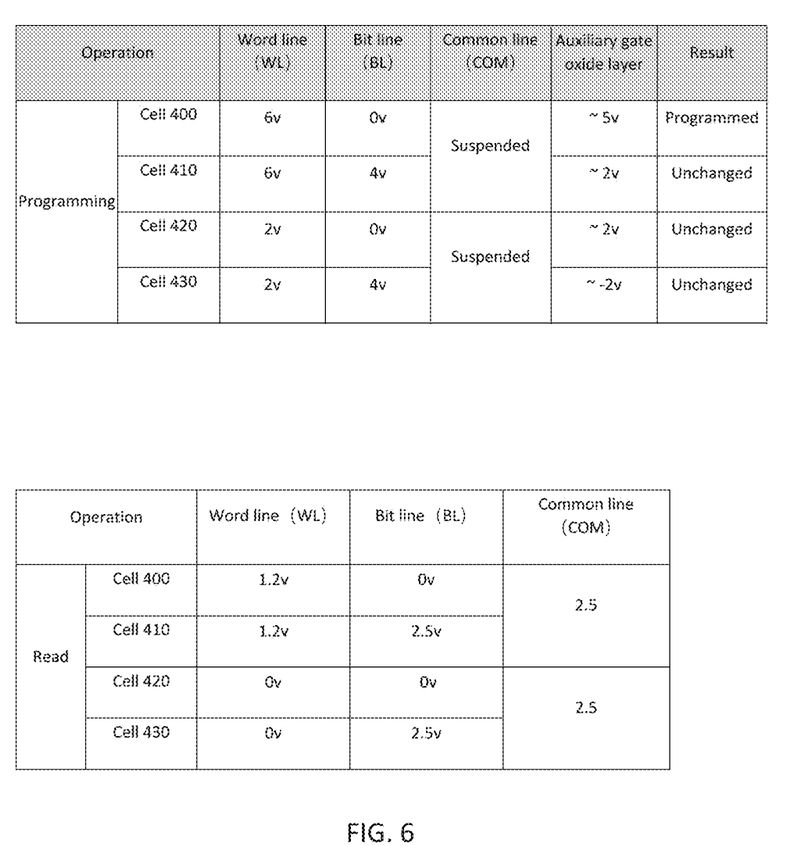
FIG. 6 shows the bias signals coupled to the memory array during different operations of the embodiment shown in FIGS. 5a-5b.

FIG. 6 shows the bias voltage of the memory array in different operation modes in the embodiment shown in FIGS. 5a-5b.

In this embodiment, the memory cell 400 is selected for independent programming, and the other three memory cells 410, 420, and 430 are not programmed.

Both the word line and the bit line of memory cell 400 are selected, and the potential of the bit line is 0 v, and the common line is suspended. Therefore, the potential on the floating gate of the NMOS transistor 401 and the auxiliary gate of the auxiliary PMOS transistor 402 is 0 v. At the same time, the word line of memory cell 400 is driven to 6v. As a result, the auxiliary gate oxide layer of the auxiliary transistor is easily broken down and turned on to change from a high-resistance state to a low-resistance state for programming, due to the small capacitance of the auxiliary transistor and a maximum allowable voltage of about 5 v for the auxiliary gate oxide layer.

The word line of memory cell 410 is selected, but the bit line is not selected. The word line is also driven to 6v, nevertheless, since the potential of the bit line is 4 v, and the common line is suspended, thus the potential of the bit line can be coupled to the floating gate and the auxiliary gate, causing the auxiliary gate oxide layer of the auxiliary transistor to withstand a voltage of about 2 v; as a result, the auxiliary gate oxide layer cannot be broken down and turned on, and a high-resistance state is maintained, no programming occurs.

The word line of the memory cell 420 is not selected, and the bit line is selected. The potential of the bit line is 0 v, and the common line is suspended. The potentials on the floating gate of the NMOS transistor 421 and the auxiliary gate of the auxiliary PMOS transistor 422 are 0V. At the same time, the word line of the memory cell 420 is driven to 2V, causing the auxiliary gate oxide layer of the auxiliary transistor to withstand a voltage of about 2V; as a result, the auxiliary gate oxide layer cannot be broken down and turned on, and a high-resistance state is maintained, no programming occurs.

Neither the word line nor the bit line of memory cell 430 is selected. The word line is also driven to 2 v, nevertheless, since the potential of the bit line is 4 v, and the common line is suspended, thus the potential of the bit line can be coupled to the floating gate and the auxiliary gate, causing the auxiliary gate oxide layer of the auxiliary transistor to withstand a voltage of about −2 v; as a result, the auxiliary gate oxide layer cannot be broken down and turned on, and a high-resistance state is maintained, no programming occurs.

In the read operation, both the word line and the bit line of the memory cell 400 are selected. The word line, the bit line, and the common line are driven to 1.2 v, 0 v, and 2.5 v, respectively. Since the memory cell 400 has been programmed, and its auxiliary PMOS transistor has been broken down and turned on, therefore the auxiliary gate and the floating gate of the NMOS transistor obtain the same potential as the word line, which is 1.2 v. By this token, the potential difference between the floating gate of the NMOS transistor and the bit line is 1.2 v, which is greater than the threshold value of 0.7-0.8 v of the NMOS transistor, the channel between the source and the drain of the NMOS transistor is turned on therefore. At the same time, the voltage difference between the bit line and the common line respectively connected to the source and the drain is 2.5 to form a lateral electric field, thereby generating a sense current which is then measured by a sensitive amplifier and driven to output a data signal of state "1".

The word line of the memory cell 410 is selected, but the bit line is not selected. The potential of the word line (1.2 v) is smaller than those of the bit line (2.5 v) and the common line (2.5 v), thus it's difficult to increase the potential of the auxiliary gate and the floating gate by coupling. Therefore, no channel is formed between the source and the drain since the potential of the floating gate of the NMOS transistor is smaller than that of the source and the drain. At the same time, no lateral electric field is formed since the source and the drain have the same potential. As a result, no sense current is produced, and the sensitive amplifier outputs a data signal of state "0".

The word lines of the memory cells 420 and 430 are not selected, and the bit line of the memory cell 430 is also not selected. The potentials of the word lines in these two memory cells are both 0 v, and the potentials of the auxiliary gate and the floating gate cannot be increased by coupling. Since the potential of the floating gate of the NMOS transistor is less than those of the bit line and the common line, their respective NMOS transistors are thus kept off, as a result, no sense current is produced, and the sensitive amplifier outputs a data signal of state "0".

What is claimed is:

1. A one-time programmable nonvolatile memory cell, comprising:
   a substrate, providing a first conductivity type well and a second conductivity type well that are adjacent; the first conductivity type well having a first active region, and the second conductivity type well having a second active region, the first active region and the second active region that are adjacent being separated by an isolation region which spans the first and the second conductivity type wells; and the first and second active regions and the isolation region being arranged parallel to each other along a first direction;
   a first MOS transistor, located on the first active region and comprising a floating gate and a floating gate oxide below the floating gate; and
   a second MOS transistor, comprising an auxiliary gate, an auxiliary gate oxide below the auxiliary gate, a source, and a drain, wherein the second active region comprises two conductive ion-doped regions respectively located at both sides of the auxiliary gate to form the source and the drain; the auxiliary gate is connected with the floating gate, one end of the floating gate and one end of the floating gate oxide of the first MOS transistor are extended from an edge of the first active region, along a second direction perpendicular to the first direction, to form the auxiliary gate and the auxiliary gate oxide respectively, and the auxiliary gate and the auxiliary gate oxide pass through the isolation region until to cover an entire of the second active region; wherein a ratio of an area of the floating gate on the first active region to an area of the auxiliary gate on the second active region is 5:1-35:1;
   wherein the first conductivity type well is an N well, and the first active region comprises two P-type doped regions respectively located at both sides of the floating gate along the first direction to serve as a source and a drain of the first MOS transistor, respectively, which is a PMOS transistor; and the second conductivity type well is a P well, and the second active region comprises two N-type doped regions respectively located at both sides of the auxiliary gate along the first direction to form the second MOS transistor which is an NMOS transistor.

2. The one-time programmable nonvolatile memory cell according to claim 1, wherein a ratio of a thickness of the floating gate oxide on the first active region to a thickness of the auxiliary gate oxide on the second active region is 1-5:1.

3. A one-time programmable nonvolatile memory cell set, comprising four said memory cells according to claim 1 arranged in an array of 2 rows×2 columns, and the substrates of all memory cells being combining into one unity;
   wherein two memory cells in each row are left-right mirror symmetrical, and the first conductivity type wells, the second conductivity type wells, the first active regions, the second active regions, and the isolation regions of the two memory cells in each row, are combined into a respective unity, and the first active regions, the second active regions, and the isolation regions are arranged in parallel to each other along the first direction;
   two memory cells in each column are centrally symmetrical, and two adjacent first active regions or two adjacent second active regions in the two memory cells in each column are separated by a respective isolation region.

4. The one-time programmable nonvolatile memory cell set according to claim 3, wherein each memory cell has the same composition and the same structure.

5. A one-time programmable nonvolatile memory, comprising an array including at least one said memory cell set according to claim 3, the memory cell sets having the same arrangement, the substrates of all memory cells in each memory cell set being formed into one unity to form a substrate;
- wherein in the array, the first conductive wells, the second conductive wells, the first active regions, the second active regions, and the isolation regions of all memory cells in each row are combined into a respective unity, and the first and the second active regions, and the isolation regions are all arranged parallel to each other along the first direction;
- in the array, two adjacent first active regions or two adjacent second active regions of two adjacent memory cells in each column are separated by a respective isolation region;
- a bit line and a common line located on both sides of each column are configured, and the bit line and the common line are alternately arranged in the array, the bit line and the common line in each column are respectively coupled to a drain and a source of the first MOS transistor on each first active region of all memory cells in the column, or respectively coupled to the source and the drain of the first MOS transistor;
- a word line is configured in each row and coupled to ion-doped regions on both sides of the auxiliary gate on each second active region of all memory cells in the row.

6. The nonvolatile memory according to claim 5, wherein each memory cell set in the array has the same composition and the same structure.

* * * * *